United States Patent
Fiolka et al.

(10) Patent No.: US 9,304,405 B2
(45) Date of Patent: Apr. 5, 2016

(54) MICROLITHOGRAPHY ILLUMINATION SYSTEM AND MICROLITHOGRAPHY ILLUMINATION OPTICAL UNIT

(75) Inventors: Damian Fiolka, Oberkochen (DE); Michael Totzeck, Schwaebisch Gmuend (DE); Hartmut Enkisch, Aalen (DE); Stephan Muellender, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1164 days.

(21) Appl. No.: 12/974,436

(22) Filed: Dec. 21, 2010

(65) Prior Publication Data

US 2011/0122392 A1    May 26, 2011

Related U.S. Application Data

(63) Continuation of application No. PCT/EP2009/003773, filed on May 27, 2009.

(60) Provisional application No. 61/076,181, filed on Jun. 27, 2008.

(30) Foreign Application Priority Data

Jun. 27, 2008   (DE) .......................... 10 2008 002 749

(51) Int. Cl.
   *G03F 7/20*      (2006.01)

(52) U.S. Cl.
   CPC ............ *G03F 7/702* (2013.01); *G03F 7/70075* (2013.01); *G03F 7/70116* (2013.01); *G03F 7/70191* (2013.01); *G03F 7/70566* (2013.01)

(58) Field of Classification Search
   CPC . G03F 7/70075; G03F 7/70191; G03F 7/702; G03F 7/70566; G02B 5/3075; G02B 5/30; G02B 5/3025; G02B 5/3058

USPC .............................. 355/53, 67, 71; 359/485.05
   See application file for complete search history.

(56) References Cited

U.S. PATENT DOCUMENTS

| 6,658,084 B2 | 12/2003 | Singer |
| 6,859,328 B2 | 2/2005 | Schultz et al. |

(Continued)

FOREIGN PATENT DOCUMENTS

| CN | 1818798 | 8/2006 |
| DE | 100 53 587 | 5/2002 |

(Continued)

OTHER PUBLICATIONS

Copy of Japanese Office Action, and its English language translation, for Japanese Patent Application No. 2011-515143, dated Mar. 14, 2013.

(Continued)

*Primary Examiner* — Steven H Whitesell Gordon
(74) *Attorney, Agent, or Firm* — Fish & Richardson P.C.

(57) ABSTRACT

An illumination optical unit for microlithography illuminates an object field with illumination light. The unit includes a first facet mirror that has a plurality of first facets, and a second facet mirror that has a plurality of second facets. The unit has facet pairs which include respectively a facet of the first facet mirror and a facet of the second facet mirror which predefine a plurality of illumination channels for illuminating the object field. At least some of the illumination channels have in each case an assigned polarization element for predefining an individual polarization state of the illumination light guided in the respective illumination channel.

13 Claims, 8 Drawing Sheets

(56) References Cited

U.S. PATENT DOCUMENTS

| | | |
|---|---|---|
| 7,304,719 B2 | 12/2007 | Albert et al. |
| 2002/0136351 A1 | 9/2002 | Singer |
| 2003/0038225 A1* | 2/2003 | Mulder et al. ............... 250/205 |
| 2003/0128320 A1* | 7/2003 | Mi et al. ....................... 349/117 |
| 2003/0227603 A1* | 12/2003 | Dierichs ........................ 355/47 |
| 2005/0140958 A1 | 6/2005 | Fiolka et al. |
| 2005/0219696 A1* | 10/2005 | Albert et al. ................. 359/489 |
| 2006/0132747 A1 | 6/2006 | Singer et al. |
| 2006/0192961 A1 | 8/2006 | Smith et al. |
| 2006/0221453 A1 | 10/2006 | Koehler et al. |
| 2007/0058151 A1 | 3/2007 | Eurlings et al. |
| 2007/0195305 A1* | 8/2007 | Mulder et al. .................. 355/71 |

FOREIGN PATENT DOCUMENTS

| | | |
|---|---|---|
| DE | 103 27 963 | 1/2005 |
| EP | 1 225 481 | 7/2002 |
| EP | 1 306 665 A2 | 5/2003 |
| JP | 07-283116 | 10/1995 |
| JP | 2005-121702 | 5/2005 |
| JP | 2006-128321 | 5/2006 |
| KR | 10 2002 0092207 | 12/2002 |
| KR | 10 2007 0087507 | 8/2007 |
| WO | WO 2005/015314 | 2/2005 |
| WO | WO 2005/026822 | 3/2005 |
| WO | WO 2006/078843 | 7/2006 |
| WO | WO 2006/111319 | 10/2006 |
| WO | WO 2006/117122 | 11/2007 |

OTHER PUBLICATIONS

Copy of English translation and Chinese office action for China Patent Application No. 2009-80129636.3, dated Mar. 12, 2013.

H. Tamada et al. "Al Wire-grid polarizer using the s-polarization resonance effect at the 0.8 μm wavelength band", Optics letters, vol. 22, No. 6, 1997, pp. 419-421.

Nomura et al., "Design, fabrication, and polarization of soft-x-ray transmission multilayers," SPIE vol. 1720 (1992) /395.

German Examination Report for corresponding DE Appl No. 10 2008 041 179.5-51, with English translation, dated Feb. 9, 2009.

Copy of International Search Report for corresponding PCT Application No. PCT/EP2009/003773, dated Sep. 18, 2009.

Chinese office action, with English translation, for CN Appl No. 2009 8012 9636.3, dated Sep. 26, 2013.

Korean Office Action for corresponding Korean Patent Application No. 10-2011-7002008 dated Aug. 25, 2015 (with English translation).

Korean decision of rejection with English translation with respect corresponding to KR Appl No. 10-2011-7002008, dated Jan. 28, 2016.

* cited by examiner

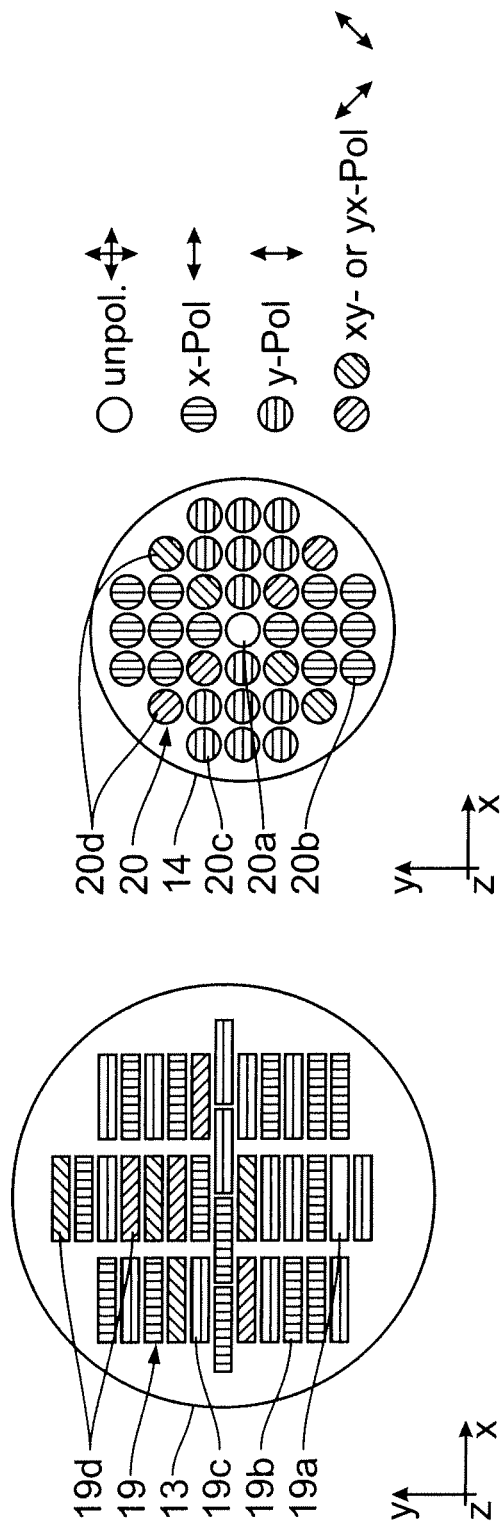
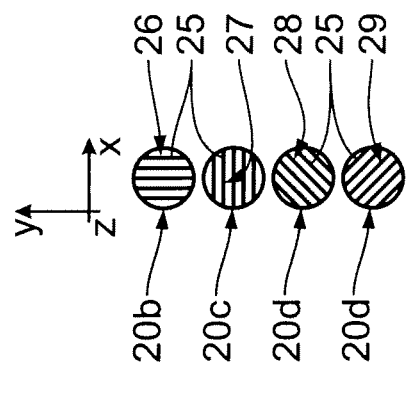
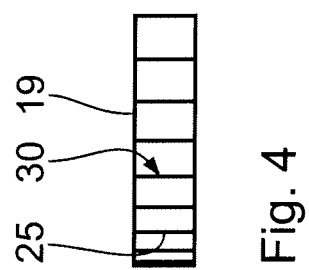
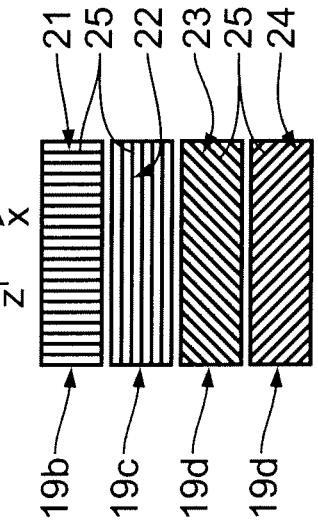

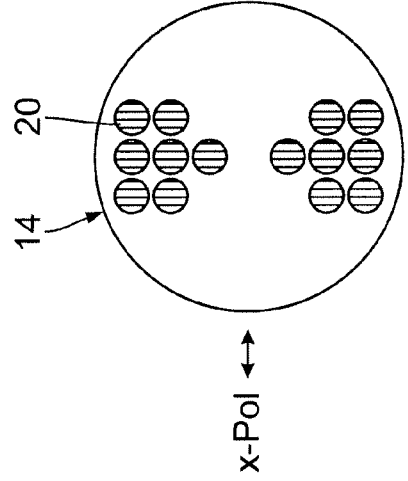
Fig. 7
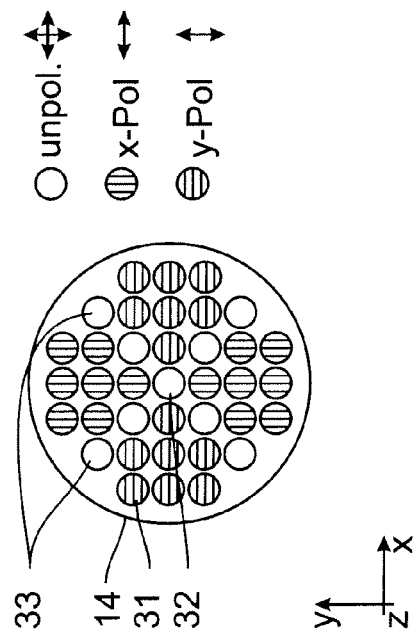
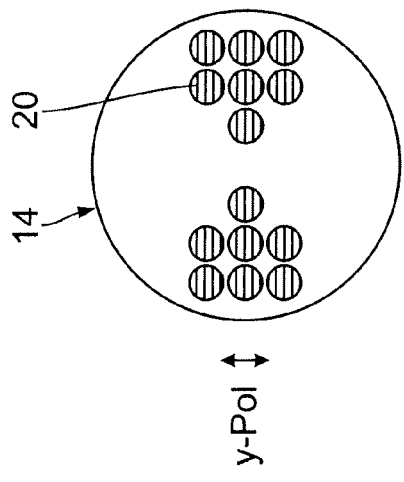
Fig. 6
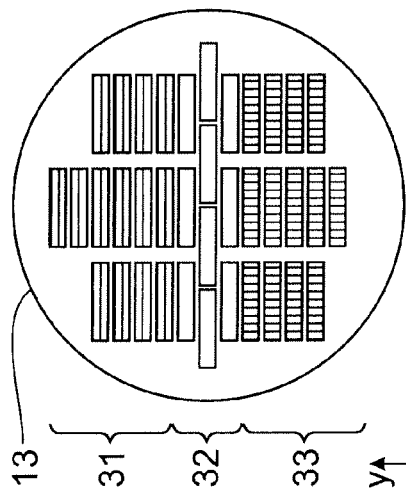
Fig. 8

MICROLITHOGRAPHY ILLUMINATION SYSTEM AND MICROLITHOGRAPHY ILLUMINATION OPTICAL UNIT

CROSS-REFERENCE TO RELATED APPLICATION

This application is a continuation of, and claims benefit under 35 USC 120 to, international application PCT/EP2009/003773, filed May 27, 2009, which claims benefit of German Application No. 10 2008 002 749.9, filed Jun. 27, 2008 and U.S. Ser. No. 61/076,181, filed Jun. 27, 2008. International application PCT/EP2009/003773 is hereby incorporated by reference in its entirety.

FIELD

The disclosure relates to a microlithography illumination optical unit, an illumination system including such an illumination optical unit, a projection exposure apparatus including such an illumination system, a method for producing a micro- or nanostructured component with the aid of such a projection exposure apparatus, and a micro- or nanostructured component produced by such a method.

BACKGROUND

Microlithography projection exposure apparatuses are disclosed in WO 2006/111319 A2 and from U.S. Pat. No. 6,859,328.

SUMMARY

The disclosure provides a microlithography illumination optical unit configured to result in illumination of the object field which ensures a high structure resolution of a downstream imaging. The disclosure also provides an illumination system including such an illumination optical unit, a projection exposure apparatus including such an illumination system, a method for producing a micro- or nanostructured component with the aid of such a projection exposure apparatus, and a micro- or nanostructured component produced by such a method.

In some embodiments, the unit includes a first facet mirror having a plurality of first facets and a second facet mirror having a plurality of second facets. The unit has facet pairs which include respectively a facet of the first facet mirror and a facet of the second facet mirror predefine a plurality of illumination channels for illuminating the object field.

For at least some of the illumination channels, the optical unit can include in each case an assigned polarization element for predefining an individual polarization state of the illumination light guided in the respective illumination channel.

It has been recognized according to the disclosure that the possibility of predefining individual polarization states depending on the illumination channel extends the flexibility in the illumination of the object field by the degree of freedom of the polarization of the illumination light. Using the polarization elements assigned to the illumination channels, a polarization state or a superposition of polarization states of the illumination light impinging on the object field points can be predefined for example in a manner dependent on illumination direction and/or in a location-dependent manner on the object field. The polarization of the illumination light can then be coordinated with the type and distribution of the structures to be imaged which are present in the object field. Specific structures in a first section of the object field can then be illuminated with illumination light having a first polarization and specific structures in another section of the object field can be illuminated with illumination light having a second polarization, which is different from the first polarization. In this way, an improvement of the imaging of structures which are present in the object field and which are illuminated via the illumination optical unit can be achieved in a structure-dependent manner.

Polarization elements which can also be used in projection exposure apparatuses are known from EP 1 306 665 A2, DE 103 27 963 A1 and US 2006/0221453 A1.

Polarization elements can influence the polarization of the illumination light on the first facet mirror. In this case, the polarization elements are arranged in the beam path upstream of the first facet mirrors or directly on the first facet mirrors.

The polarization elements can be connected to the first facets. In this case, the polarization elements can for example be adjusted simultaneously with the first facets. In this case, it is possible to achieve a relative adjustment of the polarization elements with respect to the first facets, but it is not necessary.

The polarization elements can influence the polarization of the illumination light on the second facet mirror. In this case, the polarization elements are arranged in the beam path of the illumination light upstream of the second facet mirror or directly on the second facet mirror. The nearer the polarization elements in the beam path of the illumination light are assigned to the object field, the lower the risk that a polarization state set by the polarization elements will still be disturbed on the path between the polarization element and the object field.

The polarization elements can be connected to the second facets. The advantages of such a connection correspond to those explained above with regard to the connection of the polarization elements to the first facets.

At least some of the polarization elements can be in the form of wire gratings. A wire grating constitutes a polarization element having an effective action. Because of the distance between adjacent individual wires of the wire grating, it is possible to adapt the effect of such a polarization element to the wavelength of the illumination light. A wire grating can for example also serve for setting a polarization state of illumination light which is present in the form of EUV radiation having a wavelength of between 5 nm and 30 nm.

At least some of the polarization elements can introduce a variation of the polarization effect over the cross section of the illumination channel assigned to them. Because of this, a corresponding variation of the illumination effect can be brought about in a targeted manner. This variation can have an effect depending on the arrangement of such a polarization element in the beam path of the illumination optical unit in a manner dependent on the location on the object field and/or in a manner dependent on the illumination angle on an object field point.

At least some of the polarization elements can be arranged pivotably or rotatably about a direction parallel to the illumination direction. In this way it is possible, for example when the polarization elements generate a linear polarization of the illumination light, to set a direction of this linear polarization. By pivoting the polarization elements it is possible to change between different polarization states.

At least some of the polarization elements can be arranged tiltably about a direction perpendicular to the illumination direction. In this case, it is possible to bring about a fine tuning of the effect of the polarization elements for example on the wavelength of the illumination light used.

The polarization element can in the form of a polarizing beam splitter. In this case, both the illumination light reflected by the polarization element and the illumination light transmitted by the polarization element can be utilized for an object field illumination.

The polarization element can have a plurality of mirror elements for geometrically rotating the polarization. A low-loss polarization rotation is thereby possible. In addition, a fine adjustment of the beam direction of the illumination light can be brought about via the mirror elements.

At least one polarization element can be assigned to a group of facets. A polarization element of this type can have a larger impingeable area, which often simplifies the production of the element. The illumination optical unit can contain polarization elements which are assigned to facet groups and, in addition, polarization elements which are assigned to individual facets.

The number of second facets can be greater than the number of first facets so that it is possible to change over the first facets for the illumination of different second facets and corresponding predefinition different illumination channels. Different illumination settings can be realized in this way. Using the polarization elements, corresponding polarization states can then be predefined for the respective illumination setting.

Polarization elements having a different polarizing effect can then be assigned to the second facets between which it is possible to change by the changeover of first facets. In this way, by way of example, a tangential polarization can be set in the case of a first illumination setting and a radial polarization can be set in the case of another illumination setting.

The first facet mirror can be a field facet mirror, and the second facet mirror can be a pupil facet mirror. Such an arrangement has proved to be worthwhile in practice for predefining a defined object field illumination in particular in connection with the use of EUV radiation as illumination light.

The second facet mirror can be a specular reflector. Such an arrangement is known from US 2006/0132747 A1 for example. This arrangement makes it possible to predefine both the illumination angle distribution and the intensity distribution of the illumination light over the object field via the second facet mirror.

The first facet mirror can be a faceted collector mirror. Such an arrangement has proved to be worthwhile in particular in connection with the use of a specular reflector.

The polarization elements can be arranged so that the object field can be illuminated with tangential polarization. For a series of structure arrangements in the object field, such a polarization predefinition has been found to be valuable for achieving a high resolution.

The polarization element can be a self-supporting membrane. Such a polarization element can for example also polarize EUV radiation with a high degree of polarization and at the same time order the transmission. Such a polarization element can also be used as a polarizing beam splitter.

The polarization element can have a multilayer structure. This allows a high degree of polarization to be achieved, and also provides a high reflectance and/or transmittance of the polarization element.

The polarization element can have a plurality of bilayers (double layers) that are composed of molybdenum and silicon. Such a material combination and arrangement has been found to be particularly suitable for achieving a high degree of polarization in conjunction with good transmission properties, especially when using EUV radiation as illumination light.

At least some of the illumination channels can have in each case an assigned attenuation element for attenuating the illumination light guided in the respective illumination channel. Such attenuation elements can be used for influencing the intensity of the illumination light in the respective illumination channel. This can be used for the targeted predefinition of an intensity distribution over the illumination channels and in particular for the compensation of an intensity inhomogeneity—brought about by the polarization elements, for example—over the illumination channels.

It is possible to provide a plurality of types of polarization elements which generate type-specific polarization states of the illumination light wherein each type of polarization element is assigned a type of an attenuation element. This reduces the production outlay for the illumination optical unit, since the polarization elements, on the one hand, and the attenuation elements, on the other hand, are reduced to a specific number of basic types.

The attenuation elements can influence the intensity of the illumination light on the first facet mirror. Based on this, it is possible, for example, to achieve an effect of the attenuation elements that varies over the object field. In this case, the attenuation elements are arranged in the beam path upstream of the first facet mirror or directly on the first facet mirror.

The attenuation elements can be connected to the first facets. This constrains a common displacement of the attenuation elements and of the associated first facets.

The attenuation elements can influence the intensity of the illumination light on the second facet mirror. In this case, the attenuation elements are arranged in the beam path of the illumination light upstream of the second facet mirror or directly on the second facet mirror.

The attenuation elements can be connected to the second facets. This constrains a common adjustment of the attenuation elements and of the associated second facets.

In certain embodiments, the disclosure provides an illumination optical unit for microlithography for illuminating an object field with illumination light, where the optical unit includes at least one mirror and a polarization element. The polarization unit is a wire grating that is directly applied wire grating on the at least one mirror.

The advantages of a wire grating have already been explained above. The wire gratings on the facets can be embodied with different orientations of the individual wires, with different distance profiles of the individual wires or alternatively with different thicknesses of the individual wires. This results in a large variation bandwidth of possibilities for influencing the polarization state of the illumination light which impinges on the facets of the facet mirror.

At least one of the mirrors of the illumination optical unit can be a facet mirror, wherein at least some of the facets have a polarization element in the form of a wire grating applied directly to the facets.

The wire grating mirror can be pivotable about an axis perpendicular to a reflection surface of the mirror. This enables a tuning in particular of the polarization effect in accordance with what has already been explained above.

In some embodiments, the disclosure provides an Illumination optical unit for microlithography for illuminating an object field with illumination light, where the unit includes a first facet mirror having a plurality of first facets and a second facet mirror having a plurality of second facets. The unit has facet pairs which include respectively a facet of the first facet mirror and a facet of the second facet mirror predefine a plurality of illumination channels for illuminating the object field. At least some of the illumination channels have an assigned polarization element for predefining—in a manner varying within the object field—a polarization state of the illumination light guided in the respective illumination channel.

The advantages correspond to those which have already been explained above in connection with the predefinition of a polarization state that varies over the object field. In the case of this aspect of the illumination optical unit, an individual polarization state of the illumination light guided in the respective illumination channel need not necessarily be generated. It is also possible for all the illumination channels to be influenced in a manner varying over the object field in the same way.

In certain embodiments, the disclosure provides an illumination optical unit for microlithography for illuminating an object field with illumination light, where the unit includes a polarization element that is a self-supporting membrane for predefining a polarization state of the illumination light.

The advantages of such a self-supporting membrane have already been explained.

The advantages of an illumination system including an EUV radiation source for generating an illumination light beam and an illumination optical unit according to the disclosure and the advantages of a projection exposure apparatus including an illumination system of this type and a projection optical unit for projecting an object field onto an image field correspond to those which have already been discussed above in connection with the illumination optical unit according to the disclosure. This aim correspondingly holds true for the advantages of a projection optical unit including a polarization element of this type, which can be embodied in particular as a self-supporting membrane or else as a wire grating, and for the advantages of an EUV polarization element for use in an illumination optical unit and/or a projection optical unit of an EUV projection exposure apparatus.

The different variants of the polarization elements according to the disclosure can also be used within the projection optical unit. Particularly when the projection optical unit has on the image side a numerical aperture such that imaging beam paths on the object field side or on the image field side run at an angle of incidence that differs significantly from zero, that is to say obliquely, a polarization influencing of the imaging light leads to a corresponding influencing of the imaging quality of the projection optical unit.

The disclosure provides a method for producing a microstructured component, which includes: providing a reticle; providing a wafer having a coating that is light-sensitive to the illumination light; projecting at least one section of the reticle onto the wafer with the aid of the projection exposure apparatus according to the disclosure; and developing the light-sensitive layer exposed via the illumination light on the wafer. For a micro- or nanostructured component produced by a method of this type, advantages also hold true in accordance with what has already been explained above in connection with the illumination optical unit. A component of this type can be a semiconductor component in the form of an integrated circuit, that is to say in the form of a microchip, for example.

BRIEF DESCRIPTION OF THE DRAWINGS

Exemplary embodiments of the disclosure are explained in more detail below with reference to the drawing, in which:

FIG. 2 shows schematically and in each case in a plan view a field facet mirror and also a pupil facet mirror of the illumination optical unit according to FIG. 1, wherein polarization states—assigned to illumination channels of the illumination optical unit—of a useful radiation of the projection exposure apparatus which are superposed to form a tangential overall polarization illumination are indicated by different hatchings;

FIGS. 3 and 4 show different variants of field facets of the field facet mirror according to FIG. 2 with polarization elements that are embodied as wire gratings and have differently polarizing effects;

FIG. 5 shows four different variants of pupil facets of the pupil facet mirror according to FIG. 2 with polarization elements that are embodied as wire gratings and have differently polarizing effects;

FIGS. 6 and 7 show two dipole configurations of illuminated pupil facets of the pupil facet mirror according to FIG. 2 with assigned polarization states, once again indicated by different hatchings;

FIG. 8 shows, in an illustration similar to FIG. 2, the field facet mirror and the pupil facet mirror with an alternative illumination channel assignment of the field facet to the pupil facets, wherein sections of the field facet mirror are embodied with adjacent field facets for generating identical polarization states of the useful radiation of the projection exposure apparatus which complement one another to form an overall polarization of the object field illumination;

DETAILED DESCRIPTION

Figure 1:
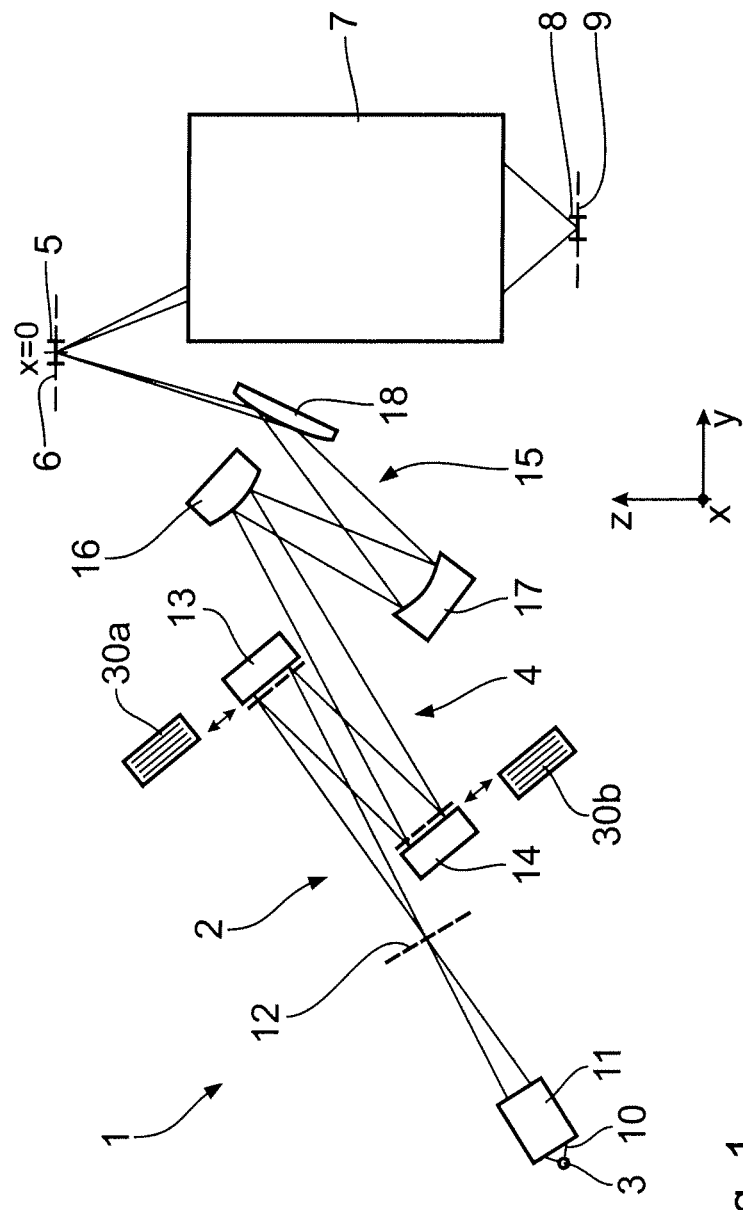
FIG. 1 schematically shows in a meridional section a projection exposure apparatus for microlithography with an illumination optical unit and a projection optical unit.

FIG. 1 schematically shows in a meridional section a projection exposure apparatus 1 for microlithography. An illumination system 2 of the projection exposure apparatus 1 has, in addition to a radiation source 3, an illumination optical unit 4 for exposing an object field 5 in an object plane 6. The object field 5 can be configured rectangularly or arcuately with an x/y aspect ratio of 13/1, for example. In this case, a reticle which is arranged in the object field 5 and is not illustrated in FIG. 1 is exposed, the reticle bearing a structure that is to be projected via the projection exposure apparatus 1 for the production of micro- or nanostructured semiconductor components. A projection optical unit 7 serves for imaging the object field 5 into an image field 8 in an image plane 9. The structure on the reticle is imaged onto a light-sensitive layer of a wafer arranged in the region of the image field 8 in the image plane 9, the wafer not being illustrated in the drawing.

The radiation source 3 is an EUV radiation source having an emitted useful radiation in the range of between 5 nm and 30 nm. It can be a plasma source, for example a GDPP source (gas discharge produced plasma), or an LPP source (laser produced plasma).

Further EUV radiation sources, for example those based on a synchrotron are also possible.

EUV radiation 10 that emerges from the radiation source 3 is concentrated by a collector 11. A corresponding collector is known from EP 1 225 481 A, for example. Downstream of the collector 11, the EUV radiation 10 propagates through an intermediate focal plane 12 before impinging on a field facet mirror 13. The field facet mirror 13 is arranged in a plane of the illumination optical unit 4 which is optically conjugate with respect to the object plane 6.

The EUV radiation 10 is also referred to as useful radiation, illumination light or as imaging light hereinafter.

Downstream of the field facet mirror 13, the EUV radiation 10 is reflected by a pupil facet mirror 14. The EUV radiation 10 impinges on the two facet mirrors 13 and 14 at an angle of incidence that is less than or equal to 25°. The EUV radiation 10 therefore impinges on the two facet mirrors in the range of normal incidence operation. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, field facets 19 (cf. FIG. 2) of the field facet mirror 13 are imaged into the object field 5 in the manner such that they are superposed on one another. The last mirror 18 of the transfer optical unit 15 is a mirror for grazing incidence ("grazing incidence mirror"). The transfer optical unit 15 together with the pupil facet mirror 14 are also referred to as sequential optical unit for transferring the EUV radiation 10 from the field facet mirror 13 towards the object field 5.

The system of Cartesian xyz coordinates is used below in order to facilitate the explanation of positional relationships. The x axis runs towards the observer perpendicularly to the plane of the drawing in FIG. 1. The y axis runs towards the right in FIG. 1. The z axis runs upwards in FIG. 1.

The reticle, which is held by a reticle holder (not illustrated), and the wafer, which is held by a wafer holder (not illustrated), are scanned synchronously in the y direction during the operation of the projection exposure apparatus 1.

Selected figures from among the subsequent figures depict a local xyz coordinate system, wherein the x axis runs parallel to the x axis according to FIG. 1 and the y axis with this x axis spans the optical area of the respective optical element.

FIG. 2 schematically shows the arrangement of the field facets 19 on the field facet mirror 13 and also the arrangement of pupil facets 20 on the pupil facet mirror 14. The field facets 19 are rectangular and have an x/y aspect ratio corresponding to the x-y aspect ratio of the object field 5. The pupil facets 20 are round. On the field facet mirror 13, thirty-seven field facets 19 are illustrated, which are assigned to the likewise illustrated pupil facets 20 of the pupil facet mirror 14, such that portions of the useful radiation 10 which impinge on a respective one of the field facets 19 are guided via the assigned pupil facet 20 further to the object field 5. Therefore, the two facet mirrors 13 and 14 define a plurality of illumination channels which guide the useful radiation 10 channel by channel towards the object field 5. Overall, there are thirty-seven illumination channels of this type in the embodiment illustrated in FIG. 2. The radiation source 3 is imaged on the pupil facets 20 in each of the illumination channels.

Overall, on the field facet mirror 13 there are four different types of field facets 19a, 19b, 19c, 19d, which, on account of polarization elements that will be explained below, have different effects on the polarization of the incident useful radiation 10, that is to say generate different polarization states upon reflection of the useful radiation 10 at the field facets 19.

On the field facet mirror 13 there is a field facet of the type 19a, which has no influence on the polarization state of the useful radiation 10 impinging on the field facet mirror 13 in unpolarized fashion, such that the useful radiation 10 downstream of the field facet of the type 19a is still present in unpolarized fashion.

On the field facet mirror 13 there are a total of fourteen field facets of the type 19b, which are distributed statistically over the field facet mirror 13. From the useful radiation 10 incident in unpolarized fashion, the field facets of the type 19b generate useful radiation 10 that is linearly polarized in the x direction, that is to say x-polarized. This polarization state x-Pol is indicated on the right in FIG. 2.

The field facet mirror 13 furthermore has a total of fourteen field facets of the type 19c, which generate, from the useful radiation 10 incident in unpolarized fashion, useful radiation 10 that is linearly polarized in the y direction, that is to say y-polarized. This polarization state y-Pol is also indicated on the right in FIG. 2.

The field facet mirror 13 furthermore has eight field facets of the type 19d, which generate, from the useful radiation 10 incident in unpolarized fashion, useful radiation that is linearly polarized at 45° with respect to the x axis and with respect to the y axis. In this case, four of the field facets of the type 19d generate a linear polarization state "xy" that oscillates between quadrants II and IV of the xy coordinate system, and four field facets of the type 19d generate a polarization state "yx" that oscillates between quadrants I and III of the xy coordinate system. These two polarization states are referred to below as xy polarization or as yx polarization and are likewise illustrated on the right in FIG. 2.

The field facets of the types 19c and 19d are also arranged in a manner distributed statistically over the field facet mirror 13.

Polarization elements 21, 22, 23, 24 on the field facets of the types 19b to 19d serve for generating the polarization states "x-polarized", "y-polarized", "xy-polarized" and "yx-polarized". The polarization elements 21 to 24 are embodied as wire gratings that are composed of equidistant individual wires 25 and are oriented in accordance with the respective polarization state. The polarization elements 21 to 24 are therefore wire polarizers. The matter can be embodied in accordance with the paper by H. Tamada et al. "Al Wire-grid polarizer using the s-polarization resonance effect at the 0.8 µm wavelength band", Optics letters, Vol. 22, No. 6, 1997" page 419 et seq.

The polarization elements 21 to 24 influence the polarization of the useful radiation 10 on the field facet mirror 13. The polarizations elements 21 to 24 are connected to the field facet mirror 13.

In the case of the field facets of the type 19b, the individual wires 25 of the polarization element 21 for generating the x-polarization are arranged equidistantly alongside one another and in a manner oriented in the y direction. In the case of the field facets of the type 19b, the individual wires 25 of the polarization element 22 for generating the y-polarization are arranged equidistantly alongside one another and in a manner oriented in the x direction. In the case of the field facets of the type 19b which generate the xy-polarization, the individual wires 25 of the polarization element 23 are arranged at an angle of +45° with respect to the x axis, that is to say in a manner running from bottom left to top right in FIG. 3, and equidistantly with respect to one another. In the case of the field facets of the type 19d which generate the yx-polarization, the individual wires 25 of the polarization element 24 are arranged at an angle of −45° with respect to the x axis, that is to say in a manner running from top left to bottom right in FIG. 3, and equidistantly with respect to one another.

In the case of the polarization elements 21 to 24, therefore the individual wires 25 in each case run perpendicularly to the oscillation vector of the polarization state set thereby.

In accordance with the polarization states generated by the field facets of the types 19a to 19d of the field facet mirror 13 according to FIG. 2, corresponding individual polarization states are provided on the pupil facets 20 assigned via the illumination channels. The field facet of the type 19a deflects its portion of the useful radiation 10 onto the central pupil facet 20, which is also referred to hereinafter as pupil facet 20a. The field facets of the type 19b deflect their portion of the useful radiation 10 onto fourteen pupil facets 20 spanning a y-dipole, which are also referred to hereinafter as pupil facets of the type 20b. The field facets of the type 19b deflect their portion of the useful radiation 10 onto fourteen pupil facets 20 spanning an x-dipole, which are also referred to hereinafter as pupil facets of the type 20c. Those field facets of the type 19d which generate xy-polarization deflect their portion of the useful radiation 10 onto pupil facets 20 arranged between the dipole pupil facets of the types 20b and 20c in quadrants I and III of the pupil facet mirror 14. These pupil facets are also referred to hereinafter as pupil facets of the type 20d. Those field facets of the type 19d which generate yx-polarization deflect their portion of the useful radiation 10 onto pupil facets 20 arranged between the dipole pupil facets of the types 20b and 20c in quadrants II and IV of the pupil facet mirror 14. These pupil facets are also referred to as pupil facets of the type 20d.

Overall, therefore, an arrangement of the linear polarization states of the individual portions of the useful radiation 10 which is tangential with respect to a center of the pupil facet mirror 14 is produced on the pupil facet mirror 14.

The distribution of the polarization states on the pupil facets 20 of the pupil facet mirror 14 which is illustrated in FIG. 2 can alternatively also be produced by polarization elements 26 to 29 assigned to the pupil facets 20, the polarization elements being illustrated by way of example in FIG. 5. Insofar as such polarization elements 26 to 29 which influence the polarization of the useful radiation 10 on the pupil facet mirror 14 are provided, polarization elements connected to the field facets 19 can be dispensed with.

For the case of a polarization influencing assigned to the pupil facets 20, the central pupil facet 20a remains unchanged, since it is intended to generate precisely no polarization influencing, that is to say is intended to reflect in unpolarized fashion the useful radiation 10 incident from the field facet mirror 13 in unpolarized fashion.

The fourteen pupil facets of the type 20b that are arranged in the form of a y-dipole bear the polarization elements 26, the individual wires 25 of which run parallel equidistantly with respect to one another in the y direction. The fourteen pupil facets of the type 20c that are arranged in the form of an x-dipole bear the polarization elements 27, the individual wires 25 of which run parallel equidistantly with respect to one another in the x direction. Those pupil facets of the type 20d that are associated with xy-polarized illumination channels bear the polarization elements 28 with a course of individual wires 25 arranged parallel to one another at an angle of +45° with respect to the x axis and with respect to the y axis, that is to say from bottom left to top right in FIG. 5. Those pupil facets of the type 20d which are associated with yx-polarized illumination channels bear the polarization elements 29 with a course of individual wires 25 arranged parallel to one another at an angle of −45° with respect to the x axis and with respect to the y axis, that is to say from top left to bottom right in FIG. 5.

The two above-explained variants of arrangements of the polarization elements 21 to 24 on the field facets 19 and of arrangements of the polarization elements 26 to 29 on the pupil facets 20 in each case generate the same tangential overall polarization of the useful radiation 30 with which the object field 5 is then illuminated.

The individual wires 25 can be applied directly on the optical areas of the field facets 19 and/or pupil facets 20.

FIG. 4 shows a further variant of a polarization element 30 using the example of a field facet 19. This polarization element has a plurality of individual wires 25 corresponding to the embodiments of the polarization elements 21 to 24. However, the individual wires 25 of the polarization element 30 are not arranged equidistantly with respect to one another, but rather in the case of the polarization element 30 at a distance from one another which increases continuously from left to right in FIG. 4. In the case of the polarization element 30, the individual wires 25 run parallel to one another in the y direction. On account of the distance variation of the individual wires 25 of the polarization element 30, this results in a corresponding continuous variation of the generated polarization state x-Pol in the x direction. By way of example, the polarization state generated by the polarization element 30 can be linearly x-polarized to a high proportion at the left-hand edge in FIG. 4, while this proportion of the linear x-polarization decreases continuously towards the right in FIG. 4, in which case, by way of example, only slightly linearly x-polarized light or even unpolarized useful radiation 10 can be present at the right-hand edge of the field facet 19 in FIG. 4. The object field 5 is correspondingly illuminated with polarization of the useful radiation 10 that varies in the x direction by the field facet 19 with the polarization element 30.

As an alternative to the above-explained direct application of the individual wires 25 on the field facets 19 and the pupil facets 20, the polarization elements 21 to 24 and 26 to 30 can also be embodied as components separate from the facets 19, 20. The polarization elements 21 to 24 and 26 to 30 can then be embodied as self-supporting wire grating polarizers.

Such polarization elements separate from the facets 19, 20 can be arranged pivotably about a direction parallel to the illumination direction, that is to say the z direction in FIG. 2, such that the direction of the linear polarization can be predefined continuously for example from an x-polarization to a pure y-polarization via such polarization elements. With such polarization elements, by way of example, the tangential overall polarization state in the illumination of the pupil facet mirror 14 according to FIG. 2 can be altered towards a radial polarization state in which the illumination channels with respect to the pupil facets of the type 20b are polarized in the y direction, the pupil facets of the type 20c are polarized in the x direction and the pupil facets of the type 20d are polarized in the xy direction or in the yx direction, so that the linear polarization directions of the illumination channels of all the pupil facets 20 in each case run approximately in the radial direction.

If the polarization elements 21 to 24 or 26 to 30 are embodied as components separate from the facets 19, 20, such a component can also be assigned to a plurality of the facets 19, 20. It is thus possible, for example, for one of the polarization elements 21 to 24 or 30 to be assigned to the two field facets of the type 19b that are illustrated at the bottom right in the case of the field facet mirror 13 in FIG. 2. If such a separate polarization element assigned to a plurality of facets 19, 20 is provided, this can likewise be pivotable in order to change the polarization state, in which case the polarization states of all the illumination channels assigned to this polarization element are then adjusted in the same way.

Such separate polarization elements can be embodied as self-supporting wire gratings or else as wire gratings applied on a carrier, wherein the carrier can be a carrier which is transmissive to the useful radiation 10 or a carrier which is reflective to the useful radiation 10.

If the polarization elements are embodied as components separate from the field facets 19 and/or from the pupil facets 20, polarization elements in the manner of the polarization elements 21 to 24 and 26 top 30 can also be provided in a changeable holder arrangement. This is indicated in FIG. 1. Arranged adjacent to the pupil facet mirror 13 is a polarization element changeable holder 30a, the housing of which accommodates polarization elements 21 to 24 and 30. As is indicated by a double-headed arrow, a currently active polarization element in front of the field facet mirror 13, the element being represented in dashed fashion in FIG. 1, can be replaced by one of the polarization elements 21 to 24, 30 accommodated in the polarization element changeable holder 30a.

As an alternative and in addition, there can also be a polarization element changeable holder present adjacent to the pupil facet mirror 14, as indicated at 30b in FIG. 1. The function of the polarization changeable holder 30b assigned to the pupil facet mirror 14 corresponds to that explained above in connection with the polarization changeable holder 30a assigned to the field facet mirror 13. In the polarization changeable holder 30b assigned to the pupil facet mirror 14, polarization elements in the manner of the manner of the polarization elements 26 to 29 described above can be provided in a changeable holder arrangement.

FIGS. 6 and 7 show further possible arrangements of pupil facets 20 on a pupil facet mirror 14. Components corresponding to those which have been explained above with reference to FIGS. 1 to 5 bear the same reference numerals and will not be discussed in detail again.

In the case of the arrangement according to FIG. 6, an x-dipole arrangement including a total of fourteen pupil facets 20 is present. This is an arrangement corresponding to that of the pupil facets of the type 20c in the case of the embodiment according to FIG. 2. The useful radiation 10 in the associated illumination channels is polarized in the y direction.

In the case of the arrangement according to FIG. 7, a y-dipole arrangement including a total of fourteen pupil facets 20 is present. This is an arrangement corresponding to that of the pupil facets of the type 20b in the case of the embodiment according to FIG. 2. The useful radiation 10 in the associated illumination channels is polarized in the x direction.

In principle, in the case of an embodiment of the illumination optical unit 4, it is also possible to change over between the illuminated pupil facet configurations according to FIGS. 6 and 7. For this purpose, the field facets 19 of the field facet mirror 13 which are assigned to the pupil facets 20 can be changed over between different tilting positions, as is known for example from U.S. Pat. No. 6,658,084 B2. The associated field facets 19 are then pivotable about an axis perpendicular to a reflection surface of the field facet mirror 13. The pupil facet mirror 14 then has both the pupil facets 20 that generate the x-dipole configuration according to FIG. 6 and the pupil facets 20 that generate the y-dipole configuration according to FIG. 7. In one tilting position of the field facets 19, the useful radiation 10 impinges on the pupil facets 20 in the configuration according to FIG. 6 and, in the other tilting position of the field facets 19, the useful radiation 10 impinges on the pupil facets 20 in the configuration according to FIG. 7.

In addition, it is possible, of course, to provide even further pupil facets for other illumination configurations.

When changing over the field facet mirrors 19 for illuminating a predefined configuration of pupil facet mirrors 20, it is possible at the same time, insofar as separate polarization elements assigned to the illumination channels are provided, to predefine the polarization state of each illumination channel individually or in groups. When changing over the fourteen field facets 19 for changing between the pupil facet illumination configurations according to FIGS. 6 and 7, a change is additionally made between the y-polarization of the configuration according to FIG. 6 and the x-polarization of the configuration according to FIG. 7 by rotation of the corresponding separate polarization elements.

FIG. 8 shows a further polarization configuration of the illumination channels in an illustration similar to FIG. 2. Components corresponding to those which have already been explained above with reference to FIGS. 1 to 7 bear the same reference numerals and will not be discussed in detail again.

In the case of the field facet mirror 13 in the polarization configuration according to FIG. 8, three field facet mirror sections 31, 32, 33 each having a plurality of facet rows lying alongside one another are present.

The first field facet mirror section 31 illustrated at the top in FIG. 8 has a total of six rows of field facets 19 arranged in three facet columns, wherein the two topmost facet rows are formed by field facets 19 which are only arranged in the middle facet column. A second field facet mirror section 32, illustrated in the center of the field facet mirror 13 in FIG. 8, has three field facet rows arranged in the manner of offset building bricks. The third field facet section 33, illustrated at the bottom in FIG. 8, constitutes a mirror image of the upper field facet section 31 mirrored about a plane which is parallel to the xz plane and which contains the midpoint of the optically active area of the field facet mirror 13.

A y-polarization is present in the upper field facet mirror section 31, owing to the use of polarization elements 22. Illumination channels in which no polarization influencing of the useful radiation 10 that is incident in unpolarized fashion are present in the middle field facet section 32. An x-polarization of the useful radiation 10 is present in the lower field facet section 33, owing to the use of polarization elements 21.

In the case of the arrangement according to FIG. 8, the assignment of the field facets 19 to the pupil facets 20 is such that the polarization configuration specified in the case of the pupil facet mirror 14 in FIG. 8 is present. The polarization configurations of the pupil facet mirror 14 according to the FIGS. 8 and 2 correspond with regard to the x-dipole configuration and the y-dipole configuration. Those pupil facets 20 which were assigned to the pupil facet types 20a and 20d in the case of the configuration according to FIG. 2 are all illuminated in unpolarized fashion in the case of the configuration according to FIG. 8.

Polarization elements for polarizing the useful radiation 10 that illuminates the field facet mirror sections 31 to 33 can be arranged adjacent to the field facet mirror 13 in such a way that individual polarization elements simultaneously influence the polarization of all the field facets 19 of one of the field facet mirror sections 31 and 33. Examples of such polarization elements are described below.

Figure 9:
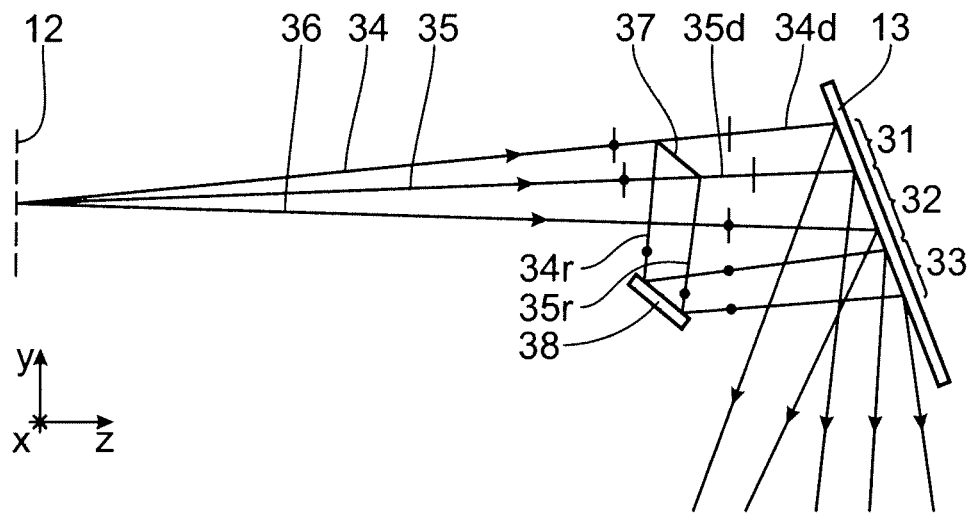
FIG. 9 shows an exemplary embodiment of a polarization element for illuminating the field facet mirror in accordance with the section by section polarization assignment according to FIG. 8.

FIG. 9 schematically shows an excerpt from the beam path of the useful radiation 10, which is indicated by rays 34, 35, 36, between the intermediate focal plane 12 and the field facet mirror 13. The upper ray 34 in FIG. 9 and middle ray 35 in FIG. 9 predefine two marginal rays which impinge precisely on a polarization element 37 in the form of a polarizing beam splitter, the more exact construction of which will be explained below. The useful radiation 10 is unpolarized upstream of the polarization element 37. The polarization element 37 is embodied in such a way that p-polarized rays, that is to say rays polarized parallel to the plane of the drawing in FIG. 9, are transmitted and s-polarized rays, that is to say rays polarized perpendicular to the plane of the drawing in FIG. 9, are reflected. The transmitted rays are designated hereinafter by the index d, and the reflected rays by the index r.

The rays 34d and 35d, which are y-polarized, impinge on the field facet mirror 13 in the region of the field facet mirror section 31. The rays 34r, 35r reflected by the polarization element, which are x-polarized, are reflected by a further deflection mirror 38 and subsequently impinge on the field facet mirror section 33. Unpolarized useful radiation 10 passing through between the polarization element 37 and the deflection mirror 38 (cf. the ray 36) impinges directly without further deflection from the intermediate focal plane 12 on the field facet mirror 13 in the region of the field facet mirror section 32.

From the field facets of the field facet mirror 13, which are not illustrated in greater detail in FIG. 9, the rays 34d, 35d, 36, 34r, 35r are reflected towards the pupil facets of the pupil facet mirror 14.

Polarization elements embodied as polarizing beam splitters can also be assigned to individual facets from among the facets 19, 20, wherein a polarization element of this type is generally assigned to at least two facets and hence two illumination channels, namely the illumination channel to which is applied the useful radiation 10 that is transmitted by the polarizing beam splitter, and the illumination channel to which is applied useful radiation which is reflected by the polarizing beam splitter. Individual polarizing beam splitters of this type can be arranged in the form of a polarization element array in front of the field facet mirror 13 or in front of the pupil facet mirror 14.

Figure 10:
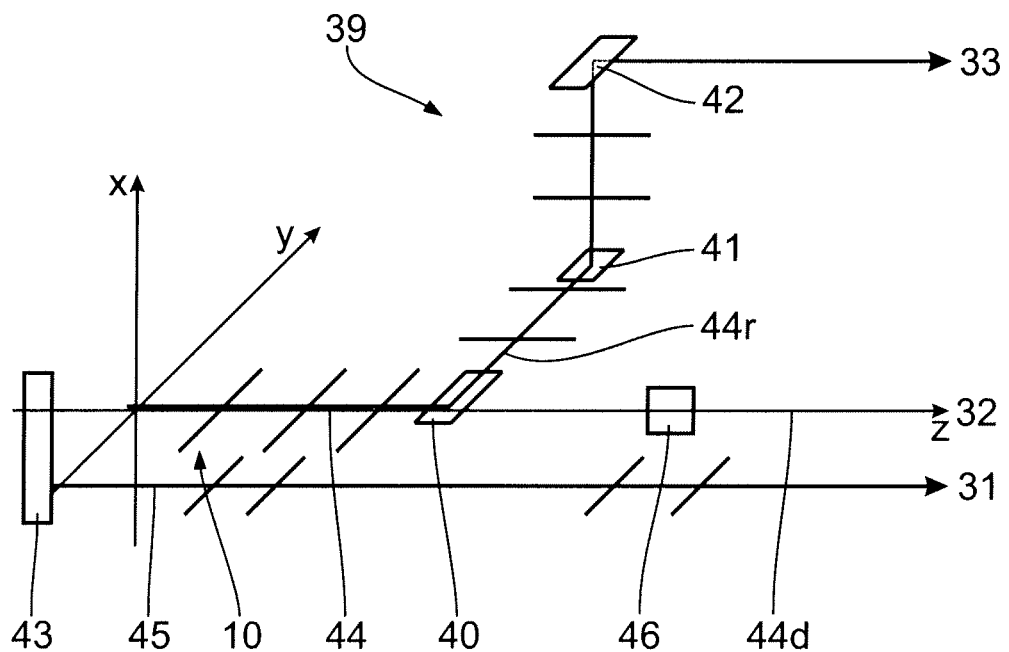
FIG. 10 shows a further embodiment of a polarization element for illuminating the field facet mirror with the section by section polarization assignment according to FIG. 8.

FIG. 10 shows a further embodiment for illumination of a polarization configuration of the field facet mirror 13 according to FIG. 8. In this case, a polarization element 39 has three mirrors 40, 41, 42 for geometrically rotating an incident polarization of the useful radiation 10. Useful radiation 10 incident from the left in the positive z direction in FIG. 10, two individual rays 44, 45 of which useful radiation are initially illustrated, is initially linearly polarized in the y direction by a y-polarizer 43. The lower ray 45 in FIG. 10 then impinges without further deflection on the field facet mirror section 31 of the field facet mirror 13. The mirror 40 is embodied as a beam splitter. The incident upper ray 44 in FIG. 10 impinges on the mirror 40. That portion of the ray 44, 44d, which is transmitted by the mirror 40 subsequently passes through a depolarizer 46 and impinges on the central field facet mirror section 32 of the field facet mirror 13 in unpolarized fashion. That portion of the ray 44, 44r, which is reflected by the mirror 40 is firstly deflected in the positive y direction by the mirror 40 and the polarization direction changes as a result of this, such that the ray 44r is z-polarized between the mirrors 40 and 41. The ray 44r is subsequently deflected in the positive x direction by the mirror 41, in which case the z-polarization is maintained. The ray 44r is subsequently deflected in the positive z direction again by the mirror 42, whereby the z-polarization is converted into an x-polarization. The ray 44r x-polarized in this way then impinges on the field facet mirror section 33 of the field facet mirror 13.

Figure 11:
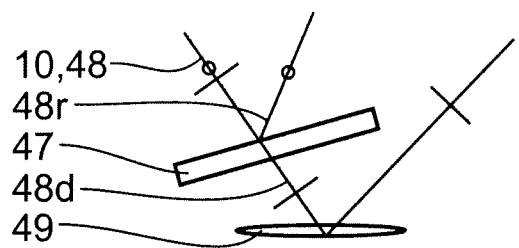
FIG. 11 shows a further embodiment of a polarization element assigned to an individual facet of the field facet mirror or of the pupil facet mirror.

FIG. 11 schematically shows the effect of a polarization element 47 which is assigned to precisely two illumination channels. The incident useful radiation 10 is illustrated in the form of a ray 48 incident in unpolarized fashion. The polarization element 47 is embodied as a polarizing beam splitter. The incident ray 48 is partly reflected (48r) by the polarization element and is then s-polarized. That portion of the ray 48 (48d) which is transmitted by the polarization element 47 is p-polarized. The transmitted portion 48d is subsequently deflected by a deflection mirror 49. Via correspondingly setting the tiltings of the polarization element 47, on the one hand, and of the deflection mirror 49, on the other hand, the ray directions of the rays 48r, 48d can be directed independently of one another onto predefined facets 19, 20 of the field facet mirror 13 or of the pupil facet mirror 14.

Figure 12:
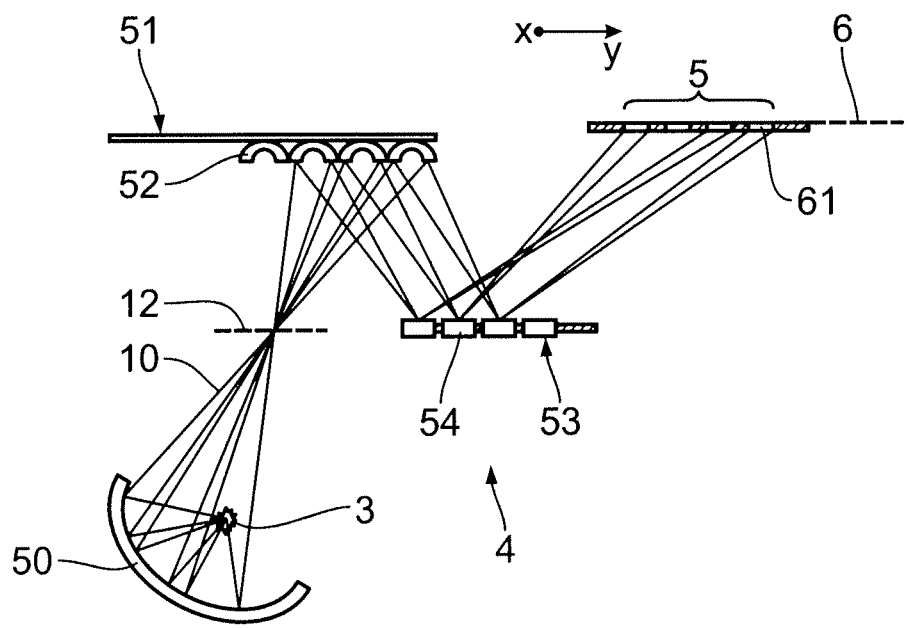
FIG. 12 shows a further embodiment of an illumination optical unit of the projection exposure apparatus according to FIG. 1 with a specular reflector.

FIG. 12 shows an alternative configuration of the illumination optical unit 4 of the projection exposure apparatus 1. Components corresponding to those which have already been explained above with reference to FIGS. 1 to 11 bear the same reference numerals and are not discussed in detail again.

Useful radiation 10 emerging from the radiation source 3, which can likewise be embodied as an LPP source, is firstly collected by a first collector 50 and then impinges on a freeform collector 51 having an array—arranged in rows and columns—of, in particular, ellipsoidally shaped collector facets 52. The collector 50 can be a parabolic mirror that images the radiation source 3 into the intermediate focal plane 12 or focuses the light in the radiation source 3 onto the intermediate focus in the intermediate focal plane 12. The collector 50 can be operated in such a way that it is impinged on by the useful radiation 10 with angles of incidence near to 0°. The collector 50 is then operated near to perpendicular incidence (normal incidence) and is therefore also referred to as a normal incidence (NI) mirror.

Disposed downstream of the freeform collector 51 is a specular reflector 53. The latter has an array of specular facets 54 arranged in rows and columns. The specular reflector 53 is arranged in a region between a conjugate pupil plane and a conjugate field plane of the projection optical unit 7 downstream of the object field 5 in the beam path of the useful radiation 10. The collector facets 52 are in each case individually assigned to the specular facets 54, such that portions of the useful radiation 10 that impinge on a respective one of the collector facets 52 are guided via the assigned specular facet 54 further to the object field 5 in the object plane 6. Consequently, the two facet mirrors 51, 53 also define a plurality of illumination channels in accordance with the illumination optical unit 4 in the embodiment from FIGS. 1 to 11, which guide the useful radiation 10 channel by channel towards the object field 5. Unlike in the case of the illumination optical unit 4 according to FIGS. 1 to 11, the illumination channels are not superposed in the object field 5, but rather illuminate the object field 5 in a manner adjoining one another.

The principle of the specular reflector is known from US 2006/0132747 A1.

Figure 13:
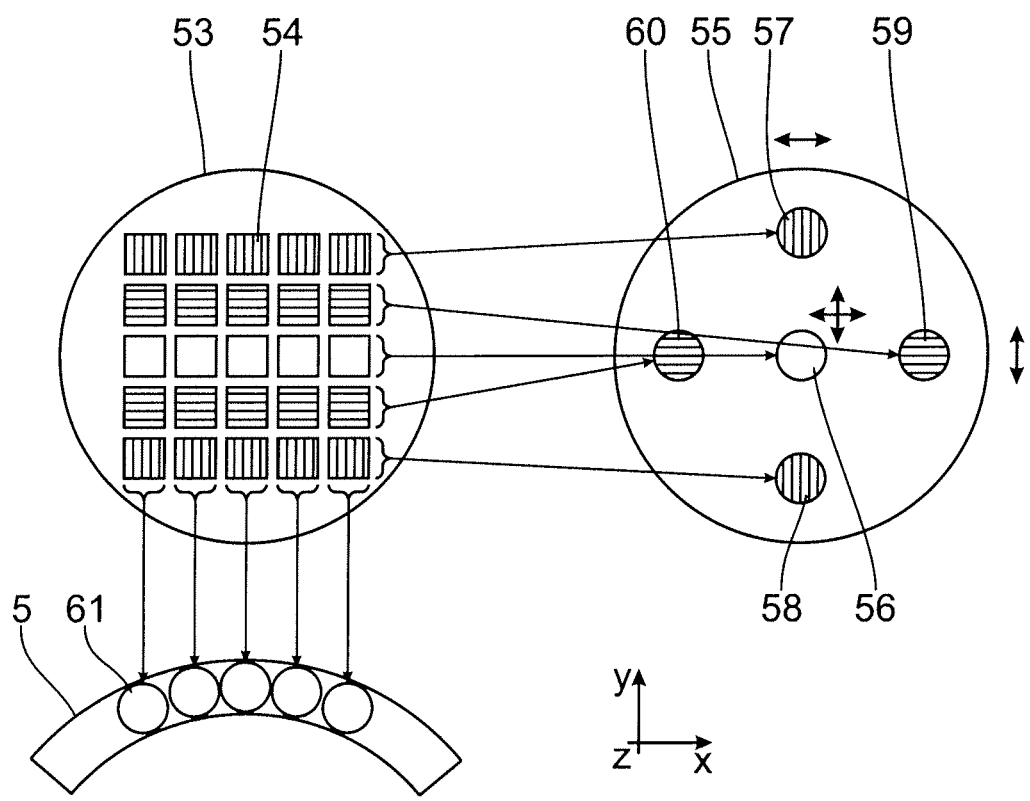
FIG. 13 schematically shows the effect of a distribution—assigned to illumination channels of the specular reflector—of different polarization states on an object field illumination with the illumination optical unit according to FIG. 12.

Polarization elements corresponding to those which have been explained above in connection with FIGS. 1 to 11 can be assigned both to the collector facets 52 and to the specular facets 54. This is explained by way of example below with reference to FIG. 13. In the schematic illustration according to FIG. 13, the specular reflector 53 has a total of twenty-five specular facets 54 arranged in rows and columns in a 5×5 grid. The specular facets 54 of the first, topmost row in FIG. 13 and of the last, bottommost row in FIG. 13 are associated with illumination channels which are assigned polarization elements for example in the manner of the polarization element 21 according to FIG. 3 which lead to an x-polarization of the useful radiation 10. The second and fourth rows of the specular facets 54 are associated with illumination channels which generate a y-polarization of the useful radiation 10 via polarization elements for example in the manner of the polarization element 22 according to FIG. 3. The central row of the specular facets 54 is associated with unpolarized illumination channels.

The arrangement of the specular facets 54 that are polarization-configured in this way is such that a polarization configuration that is illustrated on the right in FIG. 13 results in a pupil plane of the illumination optical unit 4 according to FIG. 12. Five selected partial regions of a pupil 55 are shown. Unpolarized useful radiation 10 is present in a central region 56. X-polarized useful radiation 10 is present in an upper region 57 and in a lower region 58. Y-polarized useful radiation 10 is present in a right-hand region 59 and in a left-hand region 60. Here, too, the result, therefore, is an approximately tangential polarization configuration in the case of the illumination of the object field, wherein this illumination is composed of partial field illuminations 61, as indicated schematically for example at the bottom of FIG. 13.

Figure 14:
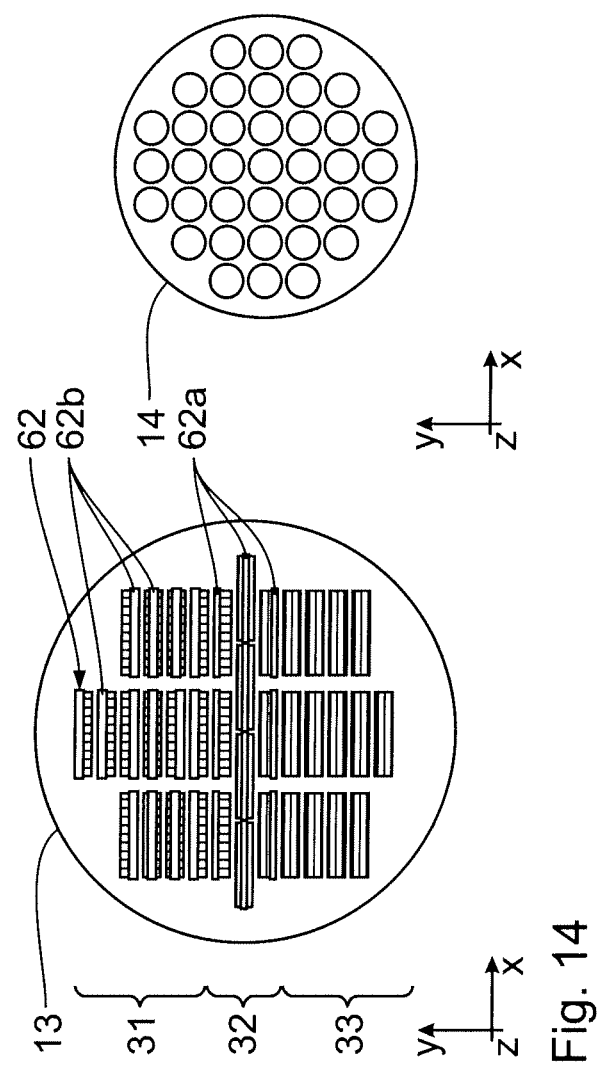
FIG. 14 shows, in an illustration similar to FIG. 2, the effect of an intensity correction on the field facets of the field facet mirror with the aid of assigned attenuation elements for the compensation of an intensity influencing by polarization elements (not illustrated)
Figure 15:
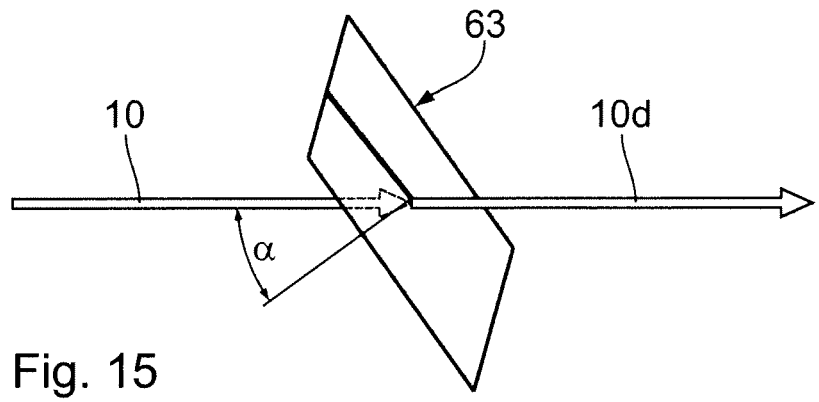
FIG. 15 shows a further embodiment of a polarization element for generating a polarization state of the useful radiation in a perspective illustration.
Figure 16:
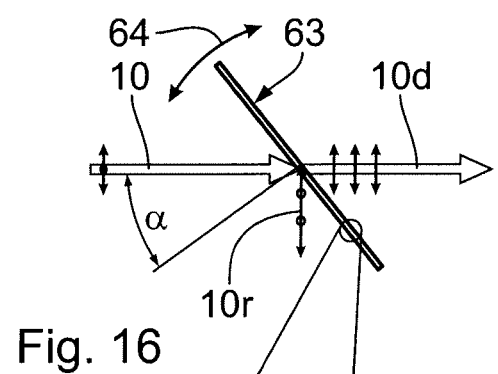
FIG. 16 shows the polarization element according to FIG. 15 in a side view.
Figure 17:
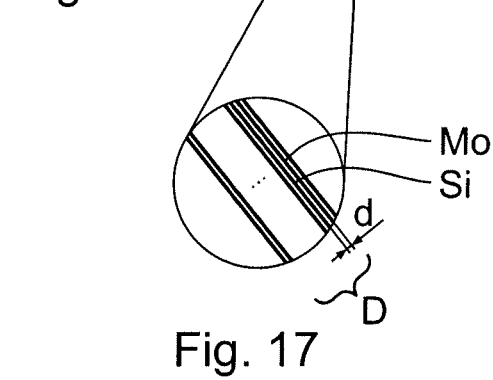
FIG. 17 shows an enlarged excerpt from FIG. 16.

FIG. 14 shows a further embodiment of a field facet mirror and of a pupil facet mirror in an illustration similar to FIG. 2. Components corresponding to those which have already been explained above with reference to FIGS. 1 to 13 bear the same reference numbers and are not discussed in detail again.

In accordance with the subdivision of the field facet mirror 13 into three field facet mirror sections 31, 32, 33 as already explained in connection with FIG. 8, the field facets 19 assigned to these sections 31 to 33 have, in the case of the embodiment according to FIG. 14, attenuation elements 62 for individually attenuating useful radiation 10 guided via illumination channels assigned to the field facets 19. The field facet mirror section 33 illustrated at the bottom in FIG. 14 has no attenuation elements in this case. The field facets 19 of the middle field facet section 32 each bear attenuation elements 62 of a first type 62*a*. These attenuation elements 62 are embodied as rectangular diaphragm bodies extending over the entire width of the field facets 19 in the x direction. The attenuation elements of the type 62*a* extend in the y direction approximately over ⅓ of the entire y extent of the field facets 19. The attenuation elements 62 can be embodied as absorbers, as reflectors or else as neutral gray filters.

In the three facet rows of the field facet section 32, the attenuation elements of the type 62*a* are present at different y positions on the respective field facets 19. The attenuation elements 62*a* attenuate the topmost third of the field facets 19 in the topmost field facet row of the field facet mirror section 32, the middle third in the middle row and the lower third of the field facets 19 in the bottom row.

Attenuation elements of the type 62*b* are present in the field facet mirror section 31 illustrated at the top in FIG. 14, which attenuation elements are likewise embodied as rectangular diaphragm bodies and likewise extend over the entire x extent of the field facets 19, but, in contrast to the attenuation elements of the type 62*a*, attenuate approximately half of the y extent of the field facets 19. In this case, the precise position of the attenuated y section of the entire y extent of the respective field facets 19 is distributed statistically over the field facets 19 of the field facet section 31. Some of the field facets 19 in the field facet section 31 are attenuated in the upper region in FIG. 14, some in the lower region and some in a central region.

The attenuation elements 62 are used to compensate for a loss of light in the illumination channels, which is compensated for via the setting of a polarization configuration in the manner of the configuration illustrated in FIG. 8. This is explained below under the assumption that when a specific polarization configuration is produced, useful radiation 10 that impinges on the field facet mirror section 33 experiences two deflections more than useful radiation 10 that impinges on the field facet mirror section 31, and experiences one deflection more than useful radiation 10 that impinges on the field facet mirror section 32. The additional loss of light on account of the deflections is compensated for by introducing a loss of light via the attenuation elements 62 such that all the illumination channels contribute to the illumination of the object field 5 with the same intensity of the useful radiation 10. This is illustrated schematically on the right in FIG. 14, which illustrates the illumination intensity of the pupil facets 20 of the pupil facet mirror 14 in the case of intensity compensation realized via the attenuation elements 62. All the pupil facets 20 of the pupil facet mirror 14 are illuminated with the same intensity on account of the compensation. The result is a correspondingly uniform illumination of the object field 5 over all the illumination channels.

In order that an intensity influencing that is dependent in the x direction over the object field 5 is effected, the attenuation elements 62 can also deviate from a rectangular form and have a contouring along the x direction.

Depending on the assignment of the attenuation elements of different types, for example of the types 62*a*, 62*b*, to the illumination channels, a specific illumination parameter-influencing effect of the attenuation elements can furthermore be produced in a targeted manner or avoided. Examples of such illumination parameters are the ellipticity and the telecentricity of the illumination of the object field 5.

Corresponding attenuation elements for influencing the intensity of the useful radiation 10 in the illumination channels can also be provided elsewhere in the respective illumination channels, for example at the pupil facet mirror 14, where ring-shaped diaphragms assigned to individual pupil facets 20 can be provided as attenuation elements. This can be used in particular for the correction of inhomogeneities of the intensity distribution in the illumination of the pupil facets 20.

The embodiment of a polarization element 63 embodied as a polarizing beam splitter is described below with reference to FIGS. 15 to 18, which polarization element can be used for example as the polarization element 37 according to FIG. 9 or as the polarization element 47 according to FIG. 11. The polarization element 63 is embodied as a self-supporting membrane having a multilayer structure. Further details concerning the multilayer construction of the polarization element 63 become apparent from the enlarged section illustration in FIG. 17. The membrane is constructed from a plurality of bilayers composed of molybdenum in the first instance, and silicon, in the second instance, wherein for example thirty bilayers of this type can succeed one another. Each of the bilayers has a total thickness d, composed of the sum of the thicknesses of the two layers of molybdenum, in the first instance, and silicon, in the second instance, of which the bilayer is constructed, of 10 nm, such that the entire membrane having the thirty bilayers has a thickness d of approximately 300 nm.

A layer stress in the self-supporting membrane, that is to say in the self-supporting multilayer, can be set by way of a layer thickness ratio of the molybdenum layer, in the first instance, to the silicon layer, in the second instance, within a bilayer, that is say within a period. This layer thickness ratio is also designated as $$\gamma = \frac{\Delta(Mo)}{\Delta(Si)}$$

where the following hold true:
$\Delta(Mo)$: layer thickness of the molybdenum layer of the bilayer; and
$\Delta(Si)$: layer thickness of the silicon layer of the bilayer.
The following additionally holds true $\Delta(Mo)+\Delta(Si)=d$.

The useful radiation 10 radiates through the polarization element 63 at an angle α of incidence of approximately 45°. The polarization element 63 has an angle of incidence range of approximately 2°, within which a transmission of s-polarized useful radiation 10 of less than 0.1% is present, whereas p-polarized useful radiation 10 has a transmission of approximately 20%. A linear degree of polarization is therefore above 99%. By changing the angle α of incidence, the linearly polarizing effect of the polarization element 63 can be coordinated with a change in the wavelength of the incident useful radiation 10.

Since the polarization element 63 is extremely thin, the tilting of the polarization element 63 for adapting the polarizing effect (cf. double-headed arrow 64 in FIG. 16) does not lead to a change of direction or to an offset of the useful radiation 10d passing through.

Figure 18:
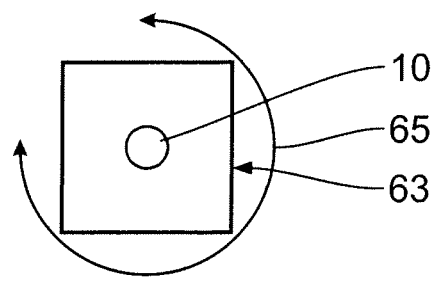
FIG. 18 shows a view of the polarization element according to FIG. 15 with the viewing direction parallel to the beam direction of the useful radiation.

The linear polarization direction of the transmitted useful radiation 10d can be set by pivoting the polarization element 63 about the beam direction of the useful radiation 10 (cf. double-headed arrow 65 in FIG. 18). Both the polarization direction and the beam direction of the reflected useful radiation 10r change at the same time.

The multilayer structure having the for example thirty bilayers can be embodied in self-supporting fashion, can be applied to a membrane composed, for example, of silicon or silicon nitride or can be applied to a supporting grating or to a combination of a membrane with a supporting grating. A self-supporting multilayer arrangement can be produced by the multilayer structure firstly being vapor-deposited onto a membrane and the latter then being removed by an etching process.

If less stringent properties are desired for the polarizing effect of the polarization element 63, the latter can also be produced from a smaller number of bilayers, for example from eighteen bilayers.

Attenuation elements in the manner of the attenuation elements 62 can also be used in the case of an illumination optical unit 4 with a specular reflector in the manner of the illumination optical unit according to FIG. 12.

Polarization elements and in particular wire grating polarizers in the manner of those which have been explained above with reference to FIGS. 3 to 5, for example, are not restricted to use on facets of a facet mirror, nor to use in the illumination optical unit 4. Such wire grating polarizers can also be provided on mirrors of the illumination optical unit 4 and/or of the projection optical unit 7 which are not subdivided into facets. Such wire grating mirrors that are not subdivided can also be mounted rotatably in order to predefine the polarization direction.

The application of the self-supporting membrane 63 is also not restricted to the beam path of the useful radiation 10 within the illumination optical unit 4. The self-supporting membrane 63 can also be provided for example within the projection optical unit 7 in the imaging beam path of the useful radiation 10 between the object field 5 and the image field 8.

What is claimed is:

1. An illumination system, comprising:
an optical unit, comprising:
a first mirror comprising a polarization element,
wherein:
the polarization element is a wire grating pivotable about an axis perpendicular to a reflection surface of the first mirror;
the optical unit is configured to be used in microlithography;
the first mirror is a first facet mirror comprising a plurality of first facets;
the illumination system further comprises a second facet mirror comprising a plurality of second facets;
a facet pair comprises a facet of the first plurality of facets and a facet of the second plurality of facets;
the facet pair defines an illumination channel;
the polarization element is configured to define an individual polarization state of EUV radiation guided in the illumination channel during use of the illumination system; and
the illumination system is configured to be used in microlithography.

2. The illumination system of claim 1, further comprising an EUV radiation source configured to generate the EUV radiation.

3. The illumination system of claim 1, wherein the wiring grating is configured to influence a polarization state of the EUV radiation on the facet of the first plurality of facets in the facet pair.

4. The illumination system of claim 1, wherein the wire grating is configured to influence a polarization state of the EUV radiation on the facet of the second plurality of facets in the facet pair.

5. The illumination system of claim 1, wherein the wire grating is configured to have a varying polarization effect on the EUV radiation over a cross section of the illumination channel.

6. The illumination system of claim 1, wherein the wire grating is assigned to a group of facets.

7. The illumination system of claim 1, wherein the number of second facets is greater than the number of first facets; and for the facet pair, the first facet is changeable so that a different one of the second plurality of facets defines the facet pair and the illumination channel.

8. The illumination system of claim 1, wherein the first facet mirror is a field facet mirror, and the second facet mirror is a pupil facet mirror.

9. The illumination system of claim 1, wherein the second facet mirror is a specular reflector.

10. The illumination system of claim 1, wherein the first facet mirror is a faceted collector mirror.

11. The illumination system of claim 1, wherein the wire grating is configured so that the object field can be illuminated with tangential polarization.

12. The illumination system of claim 1, further comprising a plurality of attenuation elements, wherein one of the attenuation elements is configured to attenuate the EUV radiation guided in the illumination channel.

13. An apparatus, comprising:
   the illumination system of claim 1; and
   a projection optical unit,
   wherein the apparatus is a microlithography projection exposure apparatus.

* * * * *

UNITED STATES PATENT AND TRADEMARK OFFICE
CERTIFICATE OF CORRECTION

PATENT NO.        : 9,304,405 B2
APPLICATION NO.   : 12/974436
DATED             : April 5, 2016
INVENTOR(S)       : Damian Fiolka et al.

Page 1 of 1

It is certified that error appears in the above-identified patent and that said Letters Patent is hereby corrected as shown below:

In the claims,

Col. 18, line 42, Claim 3, delete "wiring" and insert -- wire --.

Signed and Sealed this
Fifth Day of July, 2016

Michelle K. Lee
*Director of the United States Patent and Trademark Office*